US011762563B1

(12) United States Patent
Ray et al.

(10) Patent No.: US 11,762,563 B1
(45) Date of Patent: Sep. 19, 2023

(54) SYSTEMS AND METHODS FOR IMPROVING RADIATION TOLERANCE OF MEMORY

(71) Applicants: Biswajit Ray, Madison, AL (US); Aleksandar Milenkovic, Madison, AL (US)

(72) Inventors: Biswajit Ray, Madison, AL (US); Aleksandar Milenkovic, Madison, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 17/394,054

(22) Filed: Aug. 4, 2021

Related U.S. Application Data

(60) Provisional application No. 63/148,443, filed on Feb. 11, 2021, provisional application No. 63/142,709, filed on Jan. 28, 2021.

(51) Int. Cl.
*G06F 3/06* (2006.01)
*G11C 16/26* (2006.01)
*G11C 16/34* (2006.01)

(52) U.S. Cl.
CPC .......... *G06F 3/0616* (2013.01); *G06F 3/0655* (2013.01); *G06F 3/0679* (2013.01); *G11C 16/26* (2013.01); *G11C 16/3418* (2013.01)

(58) Field of Classification Search
CPC .... G06F 3/0616; G06F 3/0655; G06F 3/0679; G11C 16/26; G11C 16/3418
See application file for complete search history.

(56) References Cited

U.S. PATENT DOCUMENTS

| 7,491,948 | B2 | 2/2009 | Gordon et al. |
| 9,142,323 | B1* | 9/2015 | Lee ........................ G11C 5/147 |
| 9,530,512 | B2 | 12/2016 | Ray et al. |
| 9,543,028 | B2 | 1/2017 | Ray et al. |

(Continued)

OTHER PUBLICATIONS

Irom, et al., "Single Event Effect and Total Ionizing Dose Results of Highly Scaled Flash Memories," Radiation Effects Data Workshop (REDW), 2013 IEEE, pp. 1-4, Jul. 2013.

(Continued)

*Primary Examiner* — Edward J Dudek, Jr.
(74) *Attorney, Agent, or Firm* — Maynard Nexsen PC; Brian T. Sattizahn

(57) ABSTRACT

A system for improving radiation tolerance of memory senses an amount of radiation exposure and, based on the sensed amount of radiation exposure, determines whether to perform one or more techniques for mitigating the effects of the radiation exposure. As an example, the system may perform a data refresh operation by re-writing data that has been corrupted by radiation, or the system may adjust the reference voltage used to read memory cells. In another example, the system may perform a fault repair operation by re-programming cells that have erroneously transitioned from a program state to an erase state. The system may selectively perform different radiation-mitigation techniques in a tiered approach based on the sensed amount of radiation in order to limit the adverse effects of the more invasive techniques.

20 Claims, 8 Drawing Sheets

(56) References Cited

U.S. PATENT DOCUMENTS

| | | | |
|---|---|---|---|
| 9,559,113 B2 | 1/2017 | Lai | |
| 9,705,320 B1 * | 7/2017 | Detrick | |
| 10,509,132 B1 * | 12/2019 | Ray | G01T 1/026 |
| 10,878,922 B1 * | 12/2020 | Ray | G11C 16/14 |
| 11,164,642 B1 | 11/2021 | Ray et al. | |
| 2004/0041197 A1 | 3/2004 | Jong et al. | |
| 2008/0192544 A1 * | 8/2008 | Berman | G11C 11/5621 365/185.09 |
| 2009/0016115 A1 * | 1/2009 | Morancho-Montagner | G11C 29/006 365/201 |
| 2009/0184389 A1 | 7/2009 | Bertin et al. | |
| 2010/0140488 A1 | 6/2010 | Visconti | |
| 2014/0026653 A1 | 1/2014 | Del Signore | |
| 2017/0038425 A1 * | 2/2017 | Wittkop | G01T 1/244 |
| 2017/0184733 A1 * | 6/2017 | Lu | G11C 11/417 |
| 2019/0095280 A1 * | 3/2019 | Bhatia | G11C 11/5628 |
| 2019/0148286 A1 | 5/2019 | Or-Bach et al. | |
| 2019/0172545 A1 * | 6/2019 | Li | G11C 16/3495 |
| 2019/0207606 A1 * | 7/2019 | Zubkow | H03K 19/0033 |
| 2023/0060583 A1 | 3/2023 | Sanuki | |

OTHER PUBLICATIONS

Wikipedia, "Flash Memory," https://en.wikipedia.org/wiki/Flash_memory, Dec. 13, 2017.

Ray, et al., U.S. Appl. No. 17/394,061 entitled "Systems and Methods for Improving Radiation Tolerance of Three-Dimensional Flash Memory," filed Aug. 4, 2021.

* cited by examiner

SYSTEMS AND METHODS FOR IMPROVING RADIATION TOLERANCE OF MEMORY

CROSS REFERENCE TO RELATED APPLICATIONS

This application claims priority to U.S. Provisional Application No. 63/142,709, entitled "Methods for Improving Radiation Tolerance of Flash Memory System" and filed on Jan. 28, 2021, which is incorporated herein by reference. This application also claims priority to U.S. Provisional Patent Application No. 63/148,443, entitled "Layer Dependent Bit Error Variation in 3-D NAND Flash under Ionizing Radiation" and filed on Feb. 11, 2021, which is incorporated herein by reference.

RELATED ART

Memory is an important element in a variety of electronic and computer applications, and there are various types of memory that are commercially available. NAND flash memory is generally a very popular commercial nonvolatile memory (NVM) option due to its high density (greater than 1 terabyte (TB)/square inch) along with its relatively low cost (less than $1/gigabyte (GB)), lightweight and low power consumption, making it very attractive for a variety of electronic systems.

Flash memory is vulnerable to ionizing radiation that generates errors in the stored data. In this regard, flash memory generally operates by storing charge in memory cells, and the amount of charge stored in a particular cell generally defines the data value stored in that cell. Each cell is typically defined by an oxide-semiconductor layer that allows ions to tunnel through it based on applied voltage in order to change the amount of charge in a floating gate of the cell. Ionizing radiation can change the conductivity of the oxide-semiconductor layers such that a significant amount of charge may leak out of the cells thereby causing errors in the stored data.

Thus, the use of flash memory in high radiation environments, such as on vehicles or satellites that travel in outer space, has been limited. Even though shielding may be used to reduce exposure of memory systems to radiation, complete elimination of all exposure to radiation is often not feasible or even possible. In addition, radiation shields can be expensive and bulky. Techniques for increasing the resiliency of flash memory and other types of memory to radiation without significantly increasing the cost of the memory is generally desired.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Figure 1:
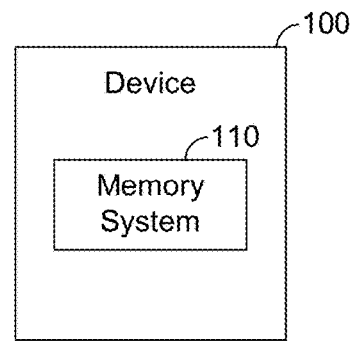
FIG. 1 is a block diagram illustrating an exemplary device with a memory system.

The present disclosure generally pertains to systems and methods for improving radiation tolerance of memory. In some embodiments of the present disclosure, a portion of memory is allocated for sensing radiation exposure. Depending on the sensed amount of radiation, a memory controller selects one or more operations for mitigating the effects of the sensed radiation. As an example, when the sensed radiation exceeds a threshold, the memory controller may perform a data refresh operation in order to read data from one area of the memory and write the data to another area. The writing of data to a new area of the memory should sufficiently fill the cells in the new area with charge making the data values less susceptible to errors from radiation-induced leakage at least for a period of time until another data refresh operation may be performed. By repetitively performing data refresh operations, the data may be maintained with an acceptable amount of tolerance over an extended period of time.

In another example, when the sensed radiation exceeds a threshold, the memory controller is configured to adjust a reference voltage, referred to a "read voltage," that is used to read values from the memory cells. In this regard, the read voltage may be reduced to account for expected charge leakage that results from exposure to the radiation. In some embodiments, the amount of reduction of the read voltage may correspond to the amount of radiation sensed. As an example, the read voltage may be reduced to a greater extent when the amount of sensed radiation is greater.

In yet another example, when the sensed radiation exceeds a threshold, an operation, referred to herein as a "fault repair" operation, may be performed in an attempt to adjust the charge levels in the memory cells to compensate for charge leakage resulting from exposure to the radiation.

In this regard, charge may be forced into cells storing erroneous data values in an attempt to restore charge that has leaked from the cell. This fault repair may be performed using a partial program operation on each cell storing an erroneous data value, and duration of the partial program operation may be controlled based on the amount of sensed radiation. As an example, the duration of the partial program operation may be greater when the amount of sensed radiation is greater to allow more charge to be forced into the erroneous cells, thereby enabling compensation for a greater amount of charge leakage. In other examples, yet other techniques for mitigating the effects of the sensed radiation are possible.

In an effort to increase memory density, at least some memory has been designed as a stacked memory structure. In such structure, layers of memory cells are stacked vertically in an integrated circuit (IC) chip so that a greater number of memory cells can be batch fabricated at a reduced cost. Three-dimensional (3D) flash memory, similar to two-dimensional (2D) flash memory, is susceptible to the effects of radiation. However, it has been observed that there is a pronounced difference in the effects of radiation on the cells of 3D flash memory depending on their locations within the stacked memory structure.

Specifically, it has been observed that cells closer to the center of a 3D memory structure are affected by radiation less than the outer cells, such as cells closer to an edge or side of the structure. This information may be leveraged to design 3D memory that better withstands the effects of radiation in an efficient and cost effective manner.

As an example, in some embodiments error correction techniques, e.g., error correction code (ECC), may be used to correct errors in the stored data, including errors that result from charge leakage. To enable the error correction, redundant information (e.g., parity bits, sometimes referred to as "ECC bits") is encoded and stored along with the data values protected by ECC. When data is later retrieved from the memory, the redundant information is used to check the data for errors and correct any errors that are detected. The maximum number of errors that may be corrected in a given data word is dependent on the amount of redundant information that is stored. In this regard, storing more redundant information or ECC bits per data word enables correction of a greater number of errors but also increases memory requirements. The strength of the ECC or, in other words, the error correction capacity of the ECC algorithm generally refers to the number of errors capable of being corrected in a given data word. That is, ECC of a greater strength generally uses more ECC bits per data word to enable the correction of a greater number of errors.

In some embodiments, ECC is used to enable the correction of at least some errors in the data stored in a 3D memory structure. However, rather than employing the same ECC strength across the entire 3D memory structure, the ECC strength is varied for different regions of the 3D memory structure based on the expected amount of radiation exposure. As an example, the 3D memory structure may be configured such that a stronger ECC is used for the data in the outer cells relative to the strength of the ECC used for the data in the inner cells that are less susceptible to radiation. Thus, the outer cells that are expected to have more data errors resulting from radiation exposure have stronger ECC thereby enabling for the correction of more errors relative to the inner cells that are expected to have fewer data errors from radiation exposure. Thus, the ECC resources are efficiently allocated such that cells likely to experience more data errors from radiation are associated with more ECC information for correcting more errors.

In other embodiments, the memory controller may be configured to select the storage locations for certain types of data based on the expected exposure to radiation. As an example, data may be prioritized, and higher-priority data (e.g., data that is more critical) may be stored in the inner cells that are less affected by radiation, whereas lower-priority data may be stored in the outer cells that are likely more affected by radiation. In other embodiments, other techniques for designing 3D memory structures to better withstand the effects of radiation are possible.

FIG. 1 is a block diagram illustrating an exemplary device 100 with a memory system 110 for storing data. The device 100 may include, but is not limited to, smartphones, mobile devices, tablets, personal digital assistants, personal computers, game consoles, game cartridges, or other devices, and the memory system 110 may be a memory card, a Universal Serial Bus flash drive, a solid-state drive or other types of memory. In an exemplary embodiment, the memory 110 may be a NAND flash architecture, although in other embodiments other types of devices 100 and other types of memory 110 are possible.

Figure 2:
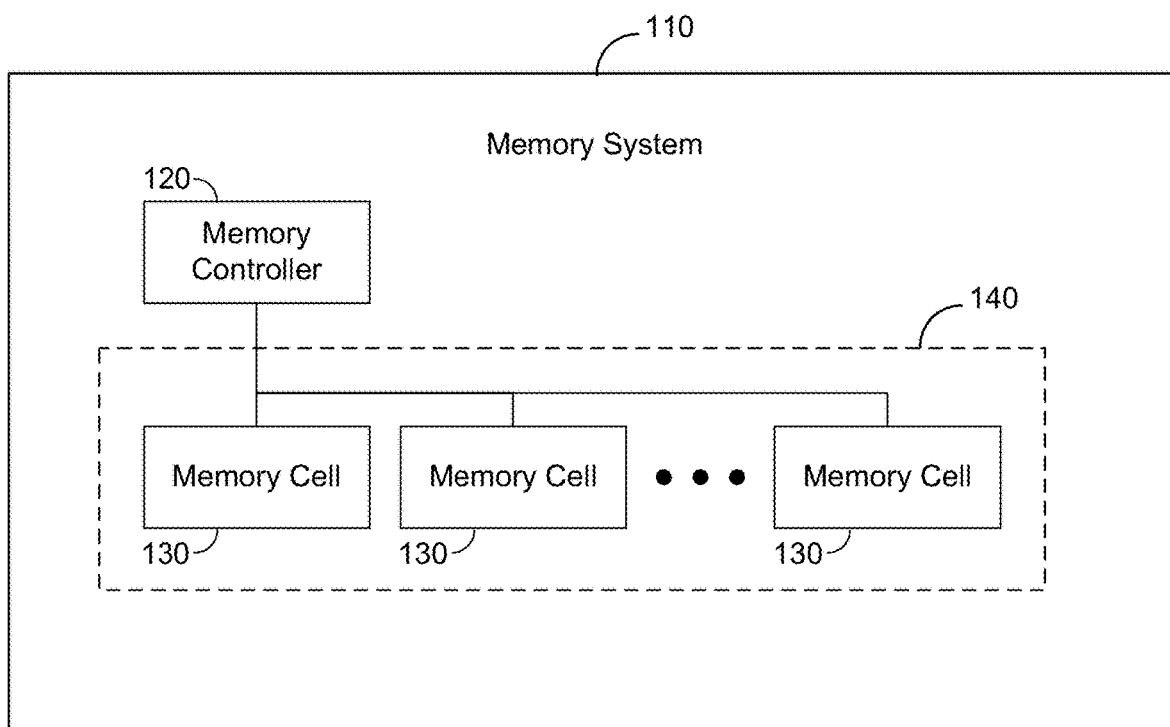
FIG. 2 is a block diagram illustrating an exemplary embodiment of a memory system, such as is depicted by FIG. 1.

FIG. 2 depicts a memory system 110 having a plurality of memory cells 130. In actuality, the memory system 110 may have any number of memory cells (e.g., from one to a trillion or more), but in FIG. 2 a few memory cells 130 are shown for simplicity of description. The memory cells 130 may be flash memory configured as NOR, NAND, VNAND or other types of arrangements. Unless otherwise indicated, it will be assumed that the memory cells shown by FIG. 2 and described herein are NAND flash memory cells, but it should be emphasized that other types of memory cells are possible (NOR flash, Resistive RAM, Ferroelectric RAM, etc.). In addition, each cell 130 of the memory system 110 may be configured for storing a desired number of charge states (e.g., bits) per cell, such as single level cell (SLC), multi-level cell (MLC), triple-level cell (TLC) or otherwise. The memory cells 130 can be located on one or more memory chips 140. Within some classes of memory chips 140, memory cells are setup in blocks and pages. A page represents the smallest unit that can be programmed to a memory chip 140. A block represents the smallest unit that can be erased from a memory chip 140. In some embodiments, there are multiple pages within each block. Note that, in the context of memory operations, the terms "program" and "write" are synonymous, and these terms shall be used interchangeably herein.

As shown by FIG. 2, the memory cells 130 may be coupled to a memory controller 120 that is configured to perform memory operations, such as reading, erasing, and programming (i.e., writing) on the memory cells 130 similar to other memory controllers known in the art. The memory controller 120 may be implemented in hardware or a combination of hardware and software. As an example, the memory controller 120 may be implemented exclusively in hardware, such as an ASIC, a field programmable gate array (FPGA), or other type of circuitry configured to perform memory operations. In another example, the memory controller 120 may comprise a processor, such as digital signal processor (DSP) or central processing unit (CPU), that is configured to execute software to perform one or more functions of the memory controller 120. The memory controller 120 may also comprise a clock (not shown) for enabling the memory controller 120 to track or otherwise determine time.

As known in the art, memory operations may be performed by applying specific voltages on connections or "lines," such as word lines and bit lines, connected to one or more memory cells 130 as appropriate for performing the desired operation. In some embodiments, memory cells 130 may be located on one or more memory chips 140 (i.e., an integrated circuit chip with memory), and the memory controller 120 may be on a separate integrated circuit (IC) chip that is electrically coupled to the memory chip 140. The memory controller 120 may transmit to a memory chip 140 a request to perform a memory operation, and the memory chip 140 may perform the requested operation applying voltages as appropriate to the memory cells 130 of the memory chip 140.

Figure 3:
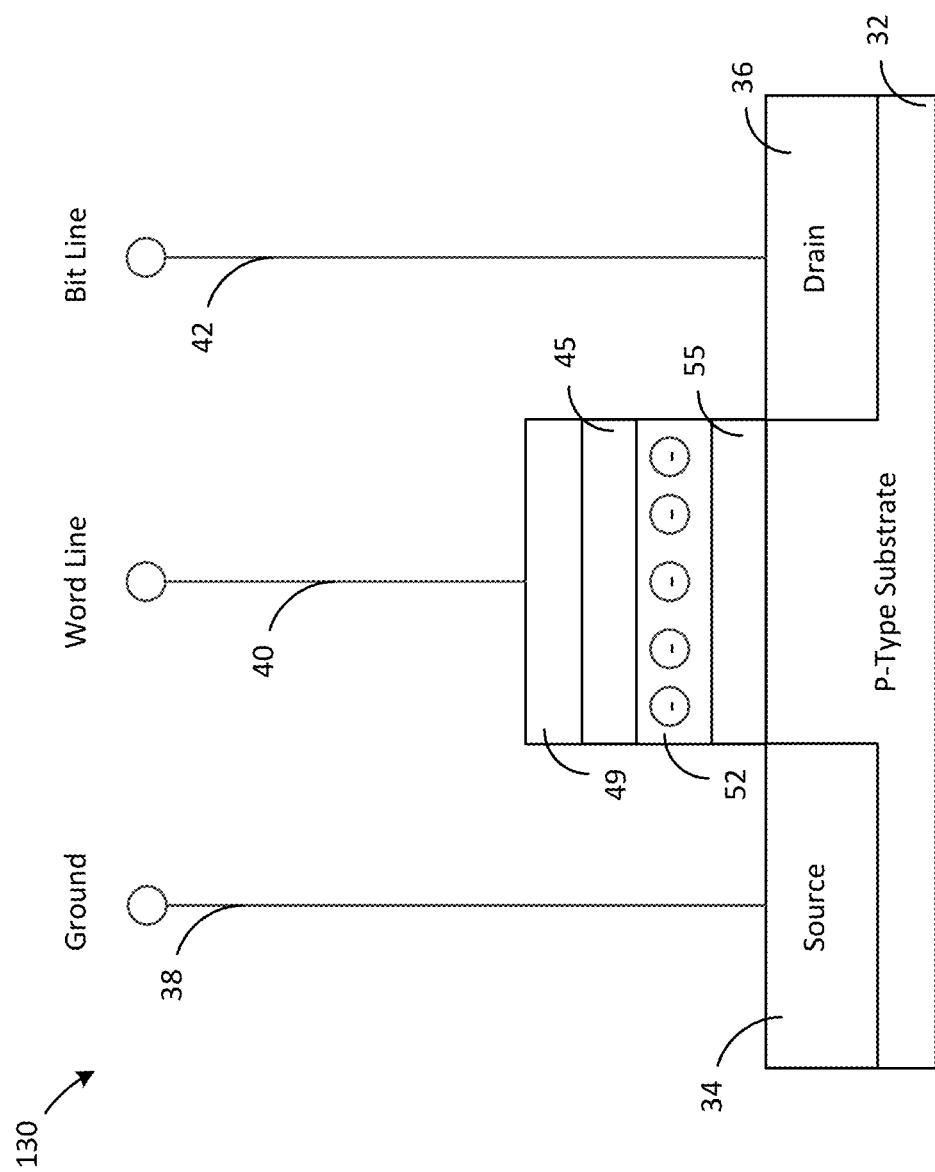
FIG. 3 is a block diagram illustrating an exemplary embodiment of a flash memory cell, such as is depicted by FIG. 2.

Flash memory is generally a type of non-volatile semiconductor memory that stores information in the form of charge on one or more floating gates 52. FIG. 3 depicts an exemplary embodiment of a flash memory cell 130, such as is depicted by FIG. 2. The memory cell 130 of FIG. 3 is depicted as essentially a standard flash memory cell and has a substrate 32, source 34, drain 36, control gate 49, and floating gate 52. The memory cell 130 has a blocking oxide 45 below the control gate 49 and a tunnel oxide 55 below the floating gate 52. The control gate 49 is connected to a word line 40, the source 34 is indirectly connected to ground by line 38, and the drain 36 is connected to bit line 42. Voltage may be applied to the cell 130 via the lines 38, 40, 42 to perform read/erase/program operations. Structurally, a flash memory cell 130 comprises a floating gate metal-oxide-semiconductor field effect transistor (FG-MOSFET), which allows electrons from the silicon substrate 32 to be tunneled into the floating gate 52 during the program operation (e.g., by applying a large positive charge differential across the control gate 49 and the substrate 32), thereby increasing the charge in the floating gate 52. The erasure operation (also referred to as an erase or erasing operation) uses tunneling to remove electrons from the floating gate 52 to the substrate 32 (e.g., by applying a large negative charge differential across the control gate 49 and the substrate 32), thereby removing charge from the floating gate 52.

A programming operation (also referred to as a program or write operation) may change selected memory cells 130 within a page from one bit value (e.g., "1") to another bit value (e.g., zero "0"). An erase operation may change all memory cells 130 within a block to a particular bit value (e.g., one "1"). In such embodiments, memory cells 130 already storing this particular bit value do not change during the erase operation. In some embodiments, memory cells 130 storing a value that changes during an operation experience more stress than memory cells 130 storing a value that is not changed by the operation. Moreover, repeatedly performing operations that change the stored bit value in a memory cell can degrade performance of the memory cell such that the memory cell eventually fails (i.e., is unable to change the stored bit value).

Figure 4:
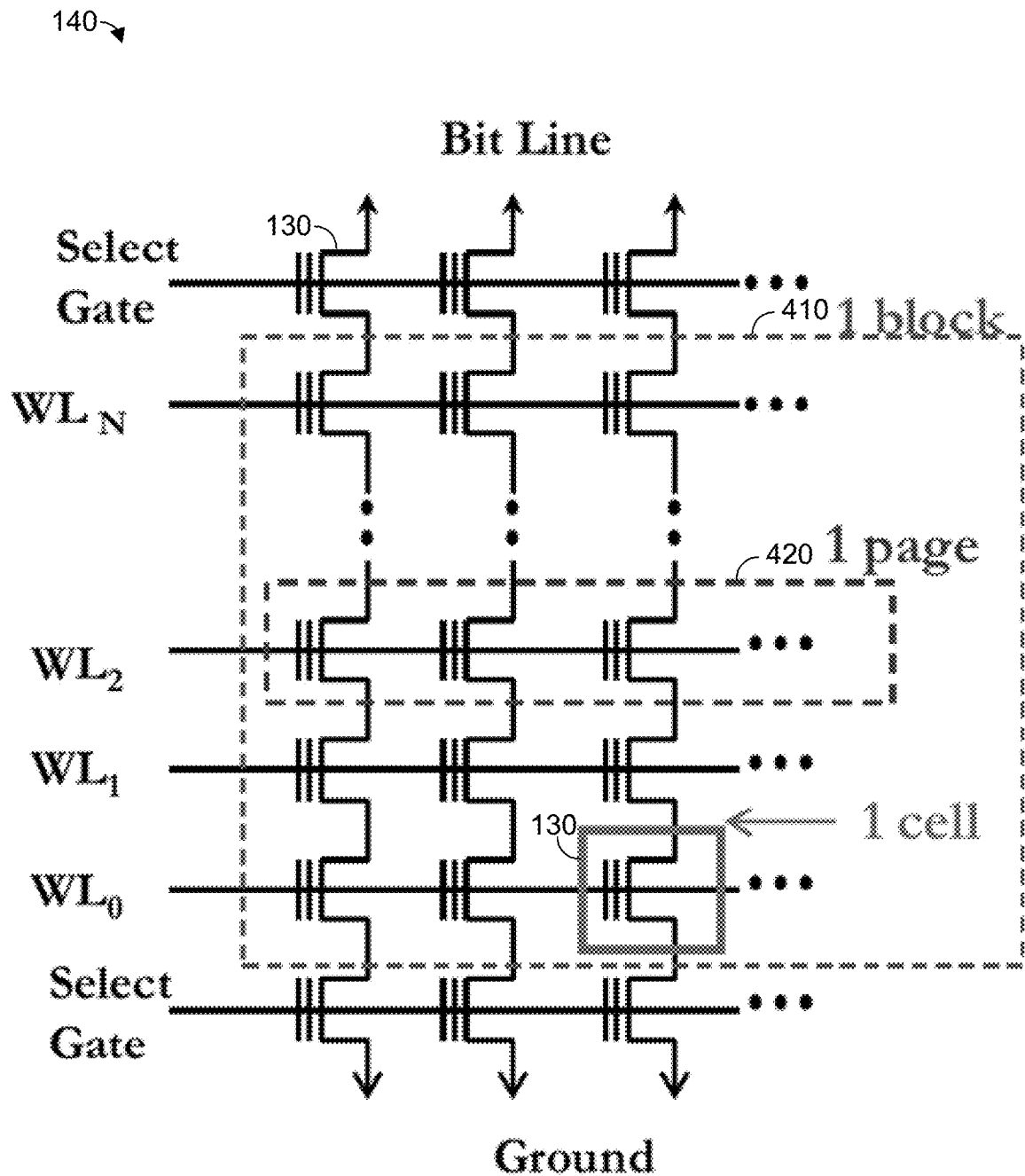
FIG. 4 is a diagram illustrating an exemplary NAND flash memory array of a memory chip depicted in FIG. 2 using cells depicted in FIG. 3.

As indicated above, FIG. 3 depicts a memory cell 130 of a memory chip 140, and FIG. 4 depicts an exemplary NAND flash memory array of memory cells 130. Flash memory chips 140 are generally arranged in one or more blocks 410. Each block 410 generally contains one or more pages 420 (e.g., a block may contain 32 pages). Each page generally holds one or more memory cells 130 representing bits (e.g., a page may contain 512 to 16 K memory cells plus additional cells for error correction, though other numbers of memory cells 130 in a page are possible). The values stored in memory cells 130 are changed through operations generally referred to as erasing and programming.

The erase operation in NAND flash typically involves setting a high voltage on the substrate 32 and a low voltage on all the control gates 49 of the block 410 causing electron tunneling from the floating gate 52. An erase operation often forces the bit value in a memory cell 130 to a logical high value (e.g., a "1"). Performance of the erase operation typically erases (e.g., removes charge from the floating gate 52 of) each memory cell 130 of the block being erased.

The program operation in NAND flash typically involves setting voltages on the lines 40, 42 to cause electron tunneling to the floating gate 52 of the memory cells 130 to be programmed and not the other memory cells 130 of the page. Thus, controlling the voltages on selected bit lines 42 and word lines 40 affects which page and memory cells 130 of a page 420 are programmed. A program operation often forces the bit value in a memory cell 130 being programmed to a logical low value (e.g., a "0"). During the programing operation, only the set of memory cells 130 to which a high gate voltage is applied are forced to the logical low bit value (e.g., from one "1" to zero "0"), and the values in the remaining memory cells 130 remain unchanged.

Figure 5:
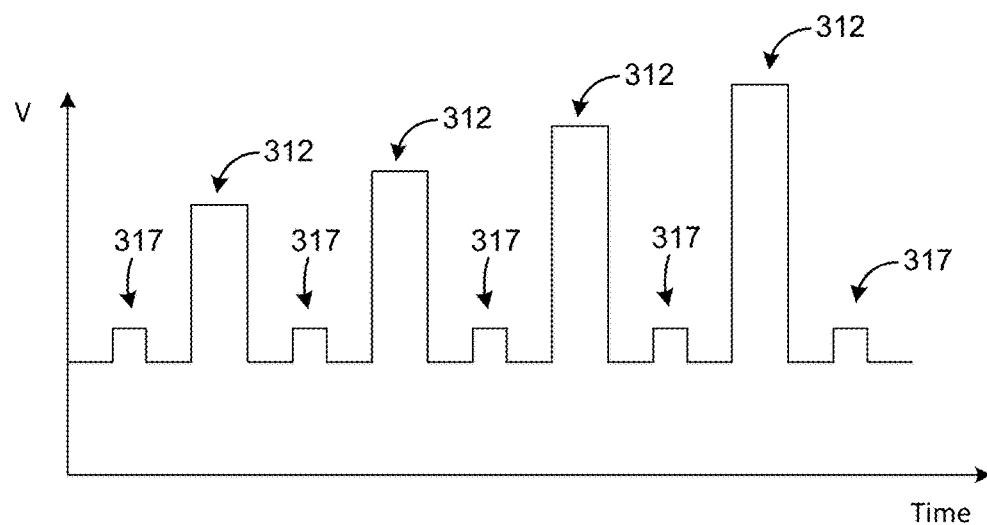
FIG. 5 is graph illustrating voltages applied to a control gate of a memory cell for performing a program operation.
Figure 6:
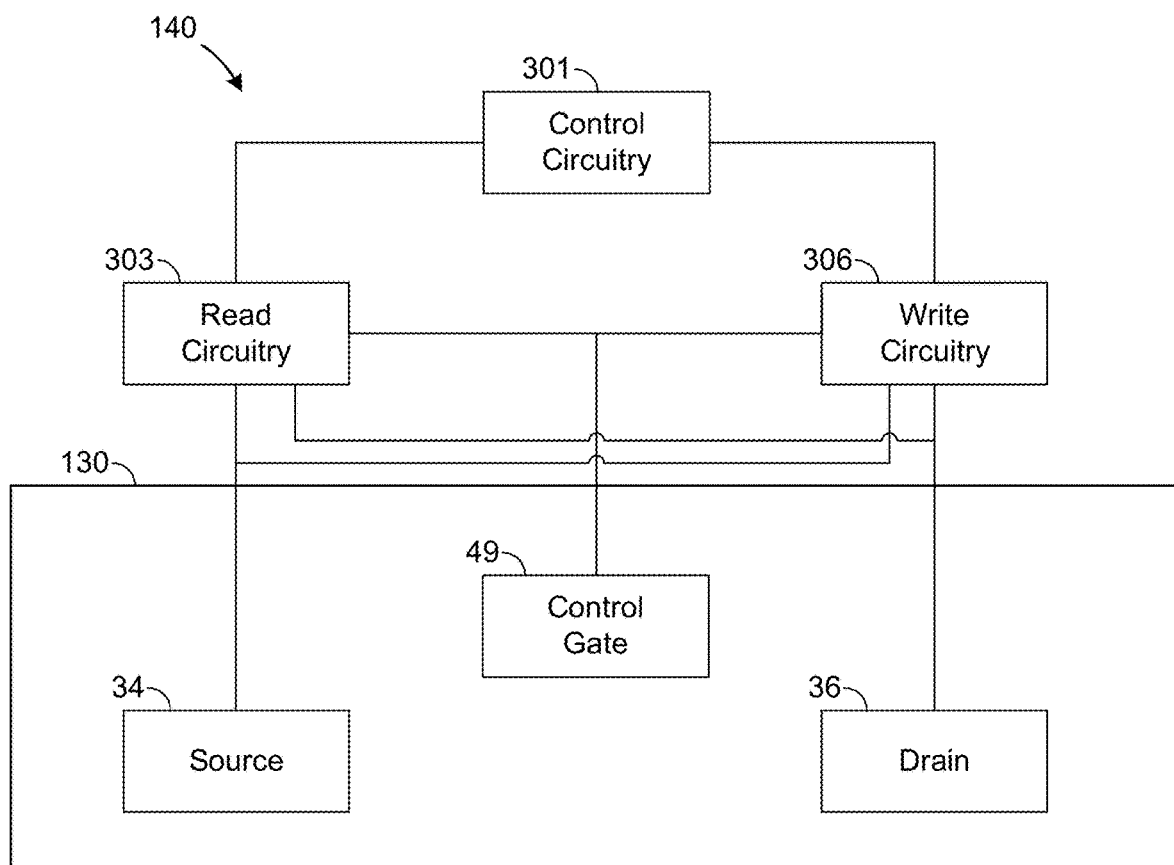
FIG. 6 is a block diagram illustrating an exemplary embodiment of circuitry within a memory chip, such as is depicted by FIG. 2.

FIG. 6 shows an embodiment of circuitry of the memory chip 140, and FIG. 5 shows exemplary voltages that may be applied to the control gates 49 of the cells 130. In this regard, the memory chip 140 comprises control circuitry 301 that is configured to control write and read operations in response to commands from the memory controller 120 (FIG. 2). As shown by FIG. 6, the memory chip 140 also comprises read circuitry 303 that is configured to read the value stored in the cell 130 and write circuitry 306 that is configured to write a value to the cell 130.

Note that any of the circuitry 301, 303, 306 may be implemented in hardware or a combination of hardware and software. As an example, any of the circuitry may be implemented as a field programmable gate array (FPGA) or application specific integrated circuit (ASIC). Any of the circuitry may include a processor, such as a digital signal processor, that is programmed with and configured to execute software. Other types of circuitry are possible in other embodiments.

When a logical low bit value (e.g., a "0") is to be written to a cell, the write circuitry 306 is configured to apply a series of voltage pulses 312, referred to hereafter as "write pulses," to the control gate 49. The voltage of each successive write pulse is increased, as shown by the increasing pulse amplitudes of the write pulses 312 in FIG. 5. Each write pulse, forces an amount of charge into the floating gate 52, thereby increasing the analog voltage level of the floating gate 52. Further, as the amplitudes of the write pulses 312 are increased, a greater amount of charge is forced into the floating gate 52 for each write pulse 312.

In between each write pulse 312, the read circuitry 303 reads the data value stored in the cell 130. This may be performed by applying a pulse 317 of $V_{ref}$, referred to herein as the "read voltage" (which is less than the voltages of the write pulses 312) to the control gate 49 and then determining whether the path between the source 34 and drain 36 is conductive. That is, the read circuitry 303 determines whether a logical high bit value or a logical low bit value is stored in the cell 130 based on whether such path is determined to be conductive. If a logical high bit value is read, the write circuitry 303 continues to apply write pulses 312 of increasing amplitude. Once the read circuitry 303 reads a logical low bit value after a write pulse 312, the process of applying the write pulses 312 is stopped for that cell 312.

Notably, when the cell 130 is storing a logical low bit value (e.g., a "0") prior to the programming operation, the write circuitry 306 does not apply any write pulses 312 because the cell 130 is already in the desired programmed state. Thus, during a normal program operation, write pulses 312 are only applied to the cells 130 having a voltage level below $V_{ref}$ such that the voltage level of a cell 130 already storing a logical low bit value is not increased by the programming operation. Further, the voltage level of each cell 130 storing a logical high bit value is increased up to the point where the voltage level exceeds $V_{ref}$, thereby transitioning the value in the cell to a logical low bit value (e.g., a "0").

In some embodiments, the memory controller 120 is configured determine a value, referred to as a "radiation value," indicative of an amount of radiation to which the memory system 110 is exposed. As an example, the memory controller 120 may be coupled to a dosimeter (not shown) that is configured to sense radiation and provide measurements of the amount of radiation that is sensed over time. In other embodiments, the memory controller 120 may allocate a portion of memory for the sensing of radiation (such portion shall be referred to hereafter as "radiation sensing memory" or "RSM"), and determine an amount of radiation to which the memory system is exposed based on data stored in RSM. In this regard, as noted above, radiation typically induces errors in the data values stored to flash memory by inducing relatively significant amounts of charge leakage in the memory cells. Thus, it is expected that more errors in the data stored in the RSM will occur in response to greater amounts of radiation.

The memory controller 120 may be configured to store known data in the RSM and then repetitively check such data in the RSM for errors. As an example, the memory controller 120 may retrieve the data stored in the RSM and compare the retrieved data to the data previously written to the RSM to determine the number of data errors or, in other words, count the number of bits that flipped from one state to another. Such number of data errors is generally proportional to radiation exposure and may be used as the radiation value. That is, greater amounts of radiation generally induce more errors such that the number of errors detected in the RSM corresponds to the amount of radiation exposure. Thus, by determining the number of data errors in the RSM, the memory controller 120 can estimate the amount of radiation to which the memory system 110 has been exposed since data was previously stored to the RSM. Techniques for using flash memory to sense radiation are described in more detail in commonly-assigned U.S. Pat. No. 10,878,922, entitled "Systems and Methods for Sensing Radiation Using Flash Memory" and issued on Dec. 29, 2020, which is incorporated herein by reference.

When the amount of sensed radiation exceeds a predefined threshold, the memory controller 120 may be configured to take one or more actions to mitigate the effects of the radiation exposure. As an example, in some embodiments, the memory controller 120 may be configured to perform a data refresh operation, which involves re-writing the data to memory. This may be performed by reading data (referred to in this context as the "refresh data") stored in one memory chip 140 and then writing this data to another memory chip 140 or to another area in the same memory chip 140 from which the data was read. Preferably, the memory cells 130 at the area to store the refresh data is preferably erased prior to writing of the refresh data. It is also possible to re-write the refresh data back to the same memory locations from which it was read. As an example, the refresh data may be read from a memory location, and the memory controller 120 may erase such memory location before re-writing the refresh data back to this same memory location.

Note that the read and program operations described above may be used to respectively read the refresh data from a memory chip 140 and then write it back to the same memory chip 140 or a different memory chip 140. For illustrative purposes, the cells storing the refresh data prior to the refresh operation shall be referred to as the "original cells," and the cells to which the refresh data is written by the refresh operation shall be referred to as the "new cells." Note that when the data is read from the original cells in the refresh operation, ECC may be used to correct any errors in the read data so that the data written to the new cells does not include the errors in the original cells induced by the radiation.

As noted above, the data refresh operation may be performed by writing the refresh data into new cells that are currently erased so that all of the new cells have been drained of charge at the time of the writing. Thus, when the data is written to the new cells in the refresh operation, each new cell that is to store a logical low bit value (e.g., a "0) of the refresh data is programmed by forcing charge into the cell until the charge in the cell surpasses the read voltage, as described above. Notably, the charge levels in the programmed new cells should be greater than the charge levels for the programmed original cells that were previously storing the refresh data prior to the refresh operation since the charge levels of the programmed original cells were reduced by radiation-induced leakage. Thus, the refresh operation generally results in greater charge levels for cells 130 in the programmed state, thereby helping to prevent data errors at least until such charge levels have been affected by other occurrences of radiation.

If the amount of radiation sensed since the performance of the refresh operation again exceeds the predefined threshold, the refresh operation may be repeated. Indeed, the refresh operation may be repeated as desired in order to keep the charge levels in the memory cells 130 storing the refresh data within a desired range so that radiation does not induce an unacceptable number of errors. However, it should be noted that repetitive performance of the refresh operation over time generally degrades the flash memory since it involves repetitively erasing and programming cells 130 of the memory. To help limit memory degradation, use of the refresh operation may be limited to when there has been a significant amount of radiation exposure in order to warrant performance of the refresh operation. In between refresh operations, other techniques having a less effect on memory degradation may be used to compensate for the effects of radiation.

As an example, as noted above, ECC may be used to correct data errors in the stored data. If small amounts of radiation are sensed, then the memory controller 120 may be configured to refrain from performing the refresh operation until greater amounts of radiation are sensed in order to limit memory degradation. In such example, the number of data errors in the memory is expected to be relatively small while the radiation exposure remains low, and ECC may be used to correct the data errors that are induced by radiation or otherwise occur from other causes. However, when the amount of sensed radiation increases to a level such that it has likely induced a number of errors approaching the correction limits of ECC, the memory controller 120 may then perform a data refresh operation in order to prevent the correction limits of the ECC from being exceeded. In such an example, the threshold used to trigger the data refresh operation may be appropriately set in order to achieve this effect. In other embodiments, other techniques may be used for determining when to perform a data refresh operation.

In some embodiments, other techniques for mitigating the effects of radiation based on a sensed amount of radiation are possible. As an example, the memory controller 120 may be configured to adjust the read voltage that is used to read the memory cells 130 based on a sensed amount of radiation.

In this regard, when the memory controller 120 determines that a sensed amount of radiation (e.g., the radiation value) exceeds a predefined threshold, the memory controller 120 may be configured to communicate with the control circuitry 301 (FIG. 6) of one or more memory chips 140 instructing the control circuitry 130 to adjust the read voltage. In response, the control circuitry 301 may be configured to control the read circuity 303 of each memory cell 130 to adjust the read voltage used for reading the cell's data value. As an example the read voltage may be reduced by an amount that corresponds the expected amount of charge leakage induced by the sensed radiation in the floating gate 52 of the cell 130. Thereafter, when a data value is read from the memory cell 130, the read circuitry 303 applies a reduced read voltage to the control gate 49 and then determines whether the path between source and drain conducts current in order to read the data value stored in the cell 130. By reducing the read voltage, it is less likely that that the charge leakage induced by the sensed radiation will result in an erroneous read of the cell 130.

Figure 7:
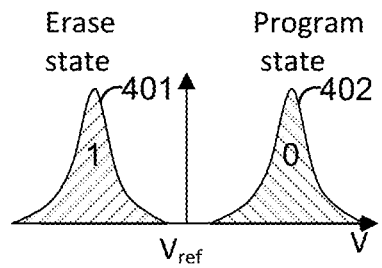
FIG. 7 illustrates exemplary voltage distributions of memory cells in a memory chip, such as is depicted by FIG. 2, relative to a reference voltage.
Figure 8:
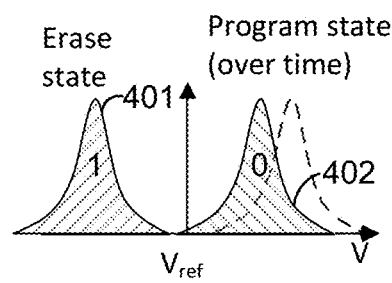
FIG. 8 illustrates exemplary voltage distributions of the memory cells of FIG. 7 after radiation has induced charge leakage, thereby reducing charge levels in the memory cells.
Figure 9:
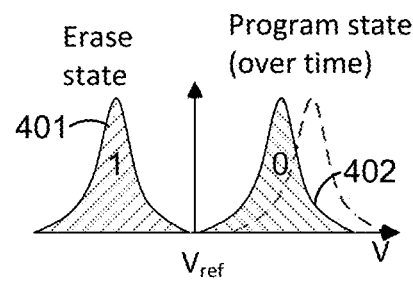
FIG. 9 illustrates the voltage distributions depicted in FIG. 8 after the reference voltage has been reduced to mitigate for the charge leakage induced by radiation.

To better illustrate the foregoing, refer to FIGS. 7-9. In this regard, FIG. 7 show an exemplary voltage distribution for charge levels in memory cells 130 storing data before an occurrence of a radiation event that induces significant charge leakage. Some of the memory cells 130 are in an erase state (storing a logical high value, such as a binary "1"), and some of the memory cells 130 are in a program state (storing a logical low value, such as a binary "0"). In this regard, curve 401 represents the distribution of cells 130 in the erase state, where each point on the curve 401 represents a number of erased cells 130 at a certain voltage or charge level. Also, curve 402 represents the distribution of cells 130 in the program state, where each point on the curve 402 represents a number or programmed cells at a certain voltage or charge level.

Ideally, the read voltage ($V_{ref}$ in FIGS. 7-9) is set such that it is about halfway between the peaks of the curves 401, 402. FIG. 8 shows the same voltage distribution after an exposure to radiation has induced a significant amount of charge leakage that reduces the charges of cells in the program state such that the read voltage is closer to the charge levels of the cells 130 in the program state. In such case, the charge levels of some of the cells 130 in the program state may fall below the read voltage, thereby causing erroneous data reads of such cells 130.

Upon sensing a significant amount of radiation (e.g., an amount of radiation exceeding a threshold), the memory controller 120 may instruct the control circuitry 301 of the memory chip 140 to reduce the read voltage such that the read voltage is more optimally set between the charge levels of cells 130 in the erase state and reduced charge levels of the cells 130 in the program state. Ideally, the read voltage would be reduced to a level where it is again about halfway between the peaks of the curves 401, 402, as shown by FIG. 9. However, any reduction in the read voltage should improve the accuracy of data reads provided that the read voltage is not moved too close to the charge levels of the cells 130 in the erase state to cause errors in the reads of those cells 130.

Note that the amount of the reduction in the read voltage may be based on the amount of radiation that is sensed. As an example, the read voltage may be reduced by a greater amount for greater levels of sensed radiation. In this regard, a greater amount of radiation will likely induce a greater amount of charge leakage such that a greater reduction of the read voltage is desirable. In some embodiments, the memory controller 120 may store a table correlating desired read voltages to radiation measurements. Thus, when a certain amount of radiation is sensed, the memory controller 120 may look up the read voltage for the sensed amount of radiation and instruct the control circuitry 301 to set the read voltage to this level. Such table may be empirically determined by testing similar memory systems, and this table may be stored in the memory controller 120 or at another location in the system 110 prior to operation. In other embodiments, other techniques for determining the desired about of reduction of the read voltage are possible.

In other embodiments, yet other techniques for mitigating the effects of radiation may be performed in response to a sensed amount of radiation. As an example, in some embodiments, the memory controller 120 is configured to perform an operation, referred to herein as a "fault repair." In such operation, the memory controller 120 identifies which memory cells 130 are in the program state (e.g., storing a charge level greater than the read voltage) and attempts to re-program these cells 130 so that any bit flips or data errors in these cells 130 are corrected. In this regard, as indicated above, charge leakage from the floating gate 52 of a cell 130 in the program state may reduce the charge in the floating gate 52 to a point where it falls below the read threshold. At this point, the data value stored in the cell 130 is erroneous since it will be read as an erased bit (e.g., a "1") rather than a programmed bit (e.g., a "0"). A transition from one state (e.g., a program state) to another (e.g., an erase state) is referred to herein as a "bit flip."

In a fault repair operation, the memory controller 120 is configured to instruct the control circuitry 301 of the memory chip 140 such that each cell 130 that has flipped from the program state to the erase state is transitioned back to the program state by forcing additional charge into the floating gates 52 of such cells 130. For each page of memory, this may be accomplished by re-writing the same data string that should currently be stored in the page. In this regard, if the same data string is written to the page, then the memory chip 140 storing the page will attempt to re-program each cell 130 that, according to the data string being written, is to be in the program state.

By using the programming techniques described above in order to re-write the same data string that should be stored in the page, cells 130 that are already in the program state (i.e., have not flipped from the program state to the erase state) at the start of the fault repair operation should not receive additional charge since they are already in the correct state. However, for each cell 130 that has erroneously flipped from the program state to the erase state, charge will be forced into the cell's floating gate 52 until the accumulated charge in the floating gate 52 exceeds the read threshold, thereby transitioning the cell 130 back to the program state. Thus, by re-programming the page with the same data string that should already be stored in the page, the cells 130 that have erroneously flipped from the program state to the erase state should be forced back to the program state, thereby correcting for errors that result from charge leakage associated with radiation exposure.

In some embodiments, the memory controller 120 is configured to perform the fault repair described above using a partial program operation rather than a normal program operation. To perform a partial program operation on a cell 130, a program operation is initiated where write pulses 312 are applied to the cell's control gate 49, as described above for FIG. 5, thereby forcing additional charge into the cell's floating gate 52. However, the timing of the partial program operation is controlled such that its duration is shorter than a full program operation considering that the floating gate 52 is already storing at least some charge from a previous program operation. That is, the partial program operation is terminated sooner than a normal program operation. Moreover, the duration of the partial program operation generally controls the amount of additional charge that may be forced into the floating gate 52. In this regard, a partial program operation of a longer duration generally allows for the application of more write pulses 312 to the cell's control gate 49 and, hence, allows more charge to be forced into the cell's floating gate 52 relative to a partial program operation of a shorter duration.

In some embodiments, the duration of the partial program operation is controlled based on the amount of sensed radiation. As an example, a longer duration of the partial program operation may be used for higher levels of sensed radiation. In this regard, as described above, a greater amount of radiation will likely induce a greater amount of charge leakage from the floating gates 52. In some embodiments, the memory controller 120 may store a table correlating desired partial programming durations to radiation measurements. Thus, when a certain amount of radiation is sensed, the memory controller 120 may look up the appropriate partial programming duration for the sensed amount of radiation and instruct the control circuitry 301 of the memory chip 140 to perform a partial program operation of this duration. Such table may be empirically determined by testing similar memory systems, and the table may be stored in the memory controller 120 prior to operation. In other embodiments, other techniques for determining the appropriate partial programming duration are possible.

Note that there are various techniques that may be used to control the duration of the partial program operation. As an example, when instructing a memory chip 140 to perform a partial program operation, the memory controller 120 may provide a time value indicative of the duration of the partial program operation. The control circuitry 301 may have a clock (not specifically shown), and use such clock to time the partial program operation so that it is terminated at the duration indicated by the memory controller 120. In another example, the memory controller 140 sends to the memory chip 140 a command (referred to as a "program command") to perform a normal program operation. However, prior to completion of a full program operation, the memory controller 140 may send a command (referred to as a "stop command") to stop (e.g., interrupt) the program operation such that it is terminated before the normal program operation is completed. That is, in response to the stop command, the control circuitry 301 of the memory chip 140 stops the program operation being performed by the write circuitry 306 prematurely so that a partial program operation of a shorter duration relative to full program operation is realized. The memory controller 140 may control the timing of transmission of the program command and the stop command so that chip 140 performs the partial program operation for the desired duration. In other embodiments, the memory controller 140 may send to the memory chip 140 a command to perform a partial program operation, and the memory chip 140 may be configured to perform a partial program operation of a predefined duration whereby the duration is not based on the sensed amount of radiation. In yet other embodiments, other techniques for causing the chip 140 to perform the partial program operation for a desired duration are possible.

Note that use of a partial program operation has various advantages. As an example, use of a partial program operation may help to prevent at least some data errors that could result from a buildup or accumulation of charge in cells 130 that are in the erase state. In this regard, as described above, program operations are typically performed on a page of memory such that voltages are applied to each cell 130 of the page being written to, including cells to be in the erase state. For each cell within the page, application of a voltage on the cell's control gate 49 determines whether the cell is forced to a program state. Ideally, no charge flows into the floating gates 52 of cells 130 that are to remain in the erase state. However, in actuality, each time a program operation (whether a normal program operation or partial program operation) is performed on a page, a small amount of charge leaks into the floating gates 52 of the cells that are in the erase state. Thus, by performing multiple fault repair operations over time on the same page of memory, charge accumulates in the floating gates 52 of cells 130 in the erase state. Eventually, if enough charge accumulates in such a cell 130, it is possible that the accumulated charge could exceed the read threshold, resulting in a bit flip or data error (i.e., an erroneous transition from the erase state to the program state). By using partial program operations rather than normal program operations to perform the fault repair, the amount of charge that leaks into the cells 130 in the erase state is decreased thereby reducing the likelihood of a bit flip that would otherwise occur when the accumulated charge exceeds the read threshold. However, note that it is possible to use full program operations instead of partial program operation, though use of the full program operations will likely accumulate more charge in the cells 130 that are in the erase state.

As indicated above, the memory controller 120 may write the same data string to a page of memory during a fault repair operation. In some embodiments, the memory controller 120 may determine the data string by reading it from the same page of memory being repaired. As noted above, ECC may be employed in the read operation such that a correct data string is read even though some of the cells 130 may have errors or flipped bits.

Figure 10A:
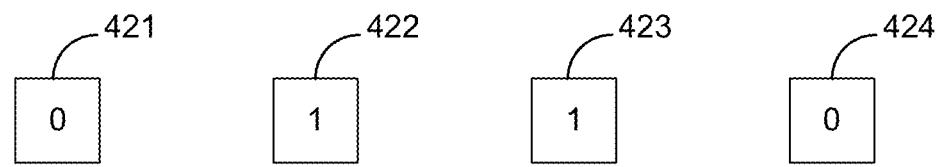
FIG. 10A is a block diagram illustrating a plurality of memory cells storing data bit values.
Figure 10B:
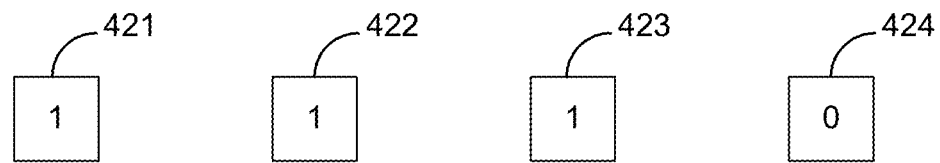
FIG. 10B is a block diagram illustrating the memory cells of FIG. 10A after the bit in one of the cells has flipped due to charge leakage resulting from exposure to radiation.

To better illustrate the foregoing, assume that the memory controller 120 performs a program operation by writing a four-bit string "0110" into previously-erased cells 421-224 of a memory chip 140, as shown by FIG. 10A. That is, the program operation forces cells 421 and 424 to the program state and leaves cells 422 and 423 in the erase state. Note that only four cells are described in this example for simplicity of illustration, but there may be any number of cells in other embodiments. Further, assume that a radiation event occurs that causes charge to leak from the cells 421 and 424 in the program state, and the amount of leakage in the cell 421 is enough to cause a bit flip in this cell 421. Specifically, as shown by FIG. 10B, the charge in the cell 421 is reduced below the read threshold such that a "1" value is erroneously read from this cell 421 when a read operation is performed.

In the current example, the memory controller 120 is configured to determine a radiation value indicative of an amount of radiation sensed by the system 110. This may be done by storing, prior to the radiation event, a certain bit string in memory that has been allocated for the radiation sensing. After the radiation event occurs, the memory controller 120 may retrieve the bit string and compare it to the bit string originally stored in order to determine a number of bits that have flipped. This number may constitute the radiation value that is indicative of the amount of sensed radiation. In this regard, a greater amount of radiation will likely cause more charge leakage and hence more bit flips. If the radiation value exceeds a threshold, the memory controller 120 may determine that a fault repair operation should be performed on at least the cells 421-424.

To perform the fault repair operation on the cells 421-424, the memory controller 120 commands the memory chip 140 having the cells 421-424 to read the cells 421-424. In response, the control circuitry 301 of the chip 140 controls the read circuitry 303 to read the cells 421-424, thereby reading the string "1110" having an erroneous bit. Note that there may be ECC bits associated with the cells 421-424 also stored in the chip 140, and the control circuitry 301 may use the ECC bits to detect the erroneous bit and correct it before returning the read string to the memory controller 120. Specifically, the string is corrected from "1110" to "0110", which is the original string stored to the The memory controller 120 then commands the memory chip 140 to write the returned string "0110" back to the cells 421-424 using a partial program operation. In some embodiments, the memory controller 120 may determine the duration of the partial program operation based on the radiation value previously described above. In this regard, the memory controller 120 may be configured to select a longer duration for a higher radiation value that indicates a greater amount of sensed radiation. As an example, the selected duration may be proportional or otherwise correspond to the sensed amount of radiation indicated by the radiation value. Note that the duration of the partial program operation is preferably selected to be sufficiently long within a desired margin of error such that any errors in the cells are likely corrected. Ideally, the duration would be the shortest amount of time needed to correct all errors in the memory being repaired.

After selecting the desired partial programming duration, the controller 120 controls the chip 140 such that a partial program operation for writing the string "0110" is performed on the cells 421-424 for the selected duration, which notably is less than the duration of a full program operation. In performing the partial program operation, the voltage applied to the control gates 49 of the cells 422 and 423 is controlled such that charge is not tunneled into the floating gates 52 of these cells except for a small amount of leakage that can occur, as described above. In addition, the cell 424 is currently in the program state, noting that the leakage induced by the radiation event in cell 424 was not significant enough to cause a bit flip in this cell 424. Since the cell 424 is already in the program state, the cell's write circuitry 306 refrains from pulsing the cell's control gate 49 with write pulses 312 such that charge is not tunneled into the floating gate 52 except for a small amount of leakage, thereby helping to prevent the cell 424 from becoming overcharged.

The cell 421, however, is erroneously in the erase state at the start of the partial program operation. Thus, in such operation, the write circuitry 306 of this cell 421 pulses the cell's control gate 49 with write pulses 312, thereby forcing charge to tunnel into the cell's floating gate 52 until the amount of charge in the floating gate 52 exceeds the read voltage (or alternatively the partial program operation ends). Thus, the erroneous bit stored in the cell 421 is repaired or, in other words, flipped back to the correct state (i.e., the program state in this example) such that the string stored in the cells 421-424 is returned to the correct value of "0110," as shown by FIG. 10A (assuming that the partial program operation is sufficiently long to allow for the flip back to the program state).

Note that any combination of the techniques for mitigating radiation may be performed. In some embodiments, a tiered approach may be used where one or more techniques are used for radiation measurements in a first range and one or more other technique are used for radiation measurements in a different range. Note that there may be any number of tiers or techniques used.

As an example, when the memory controller 120 senses radiation in a first range, referred to herein as the "low range," the memory controller 120 may be configured to adjust (e.g., reduce) the read voltage based on the amount of sensed radiation, as described above, thereby helping to prevent data errors in the memory cells 130. When the sensed radiation increases such that it surpasses the lower threshold of a second range (referred to hereafter as the "medium range"), the memory controller 120 may be configured to perform a fault repair operation in an effort to correct bits that have erroneously flipped due to radiation exposure. When the sensed radiation further increases such that it surpasses the lower threshold of a third range (referred to hereafter as the "high range"), the memory controller 120 may be configured to perform a data refresh operation by re-writing the stored data. Yet other techniques and combination of techniques may be performed in other embodiments.

Note that use of a tiered approach, as described above, enables the use of less invasive mitigation techniques when the effects of radiation are likely relatively low but allows for use of stronger mitigation techniques as the amount of sensed radiation increases. As an example, as noted above, repetitively performing the data refresh operation may degrade memory cells 130 over time. By using this technique only in the presence of a relatively high amount of sensed radiation helps to reduce the number of times that the data refresh operation is performed, thereby helping to extend the useful life of the memory. Adjustment of the read threshold can be performed without significant degradation of the memory cells 130 such that this technique may be performed often without much adverse effect. Similarly, fault repair operations degrade memory less than data refresh operations since they may be performed without erasing. Using less invasive techniques, such as adjustment of the read voltage and fault repair operations allows for more invasive techniques, such as data refresh operations, to be performed less frequently while still achieving a desired resiliency to the effects of radiation exposure.

In several embodiments described herein, the memory controller 120 is described as being external to the memory chips 140 under its control. As an example, the memory controller 120 may reside in an IC chip separate from a memory chip 140 that is controlled by the memory controller 120. In some embodiments, the memory controller 120 and the memory chip 140 may reside on a printed circuit board (PCB) having conductive traces that electrically connect the memory controller 120 to the memory chip 140. However, other configurations are possible in other embodiments. For example, it is possible for the memory controller 120 and the memory cells 130, as well as the control circuitry 301, read circuitry 303, and the write circuitry 306, to be within the same integrated circuit in other embodiments.

Figure 11:
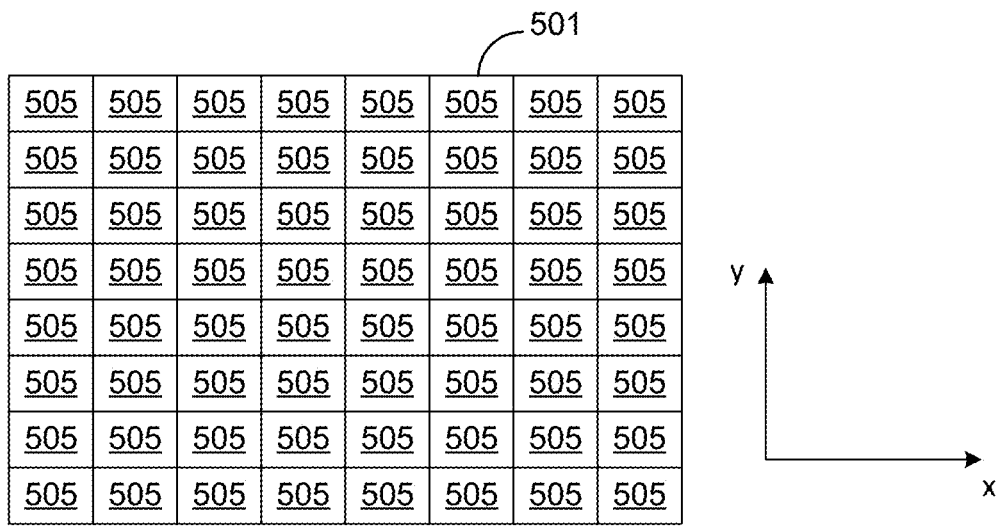
FIG. 11 is a block diagram illustrating an exemplary embodiment of a three-dimensional (3D) memory structure having vertically-stacked memory cells.

As noted above, some memory systems 110 have memory chips for which cells 130 are stacked vertically forming a three dimensional (3D) memory structure with cells arranged in rows and columns. As example, FIG. 11 shows a memory structure 501 having memory cells 505 arranged in rows and columns extending in the x-direction and y-direction respectively. Note that rows of memory cells 505 may extend in a direction (z-direction) perpendicular to both the x-direction and the y-direction, similar to how cells 505 extend in the x-direction for FIG. 11 for the x-direction, such that multiple cells 505 extend in all three dimensions. For illustrative purposes, it will be assumed hereafter that each cell 505 is a flash memory cell, but it is possible for the cells 505 to be other types of memory in other embodiments. Notably, the structure may be manufactured within a memory chip 140 (FIG. 3).

Figure 12:
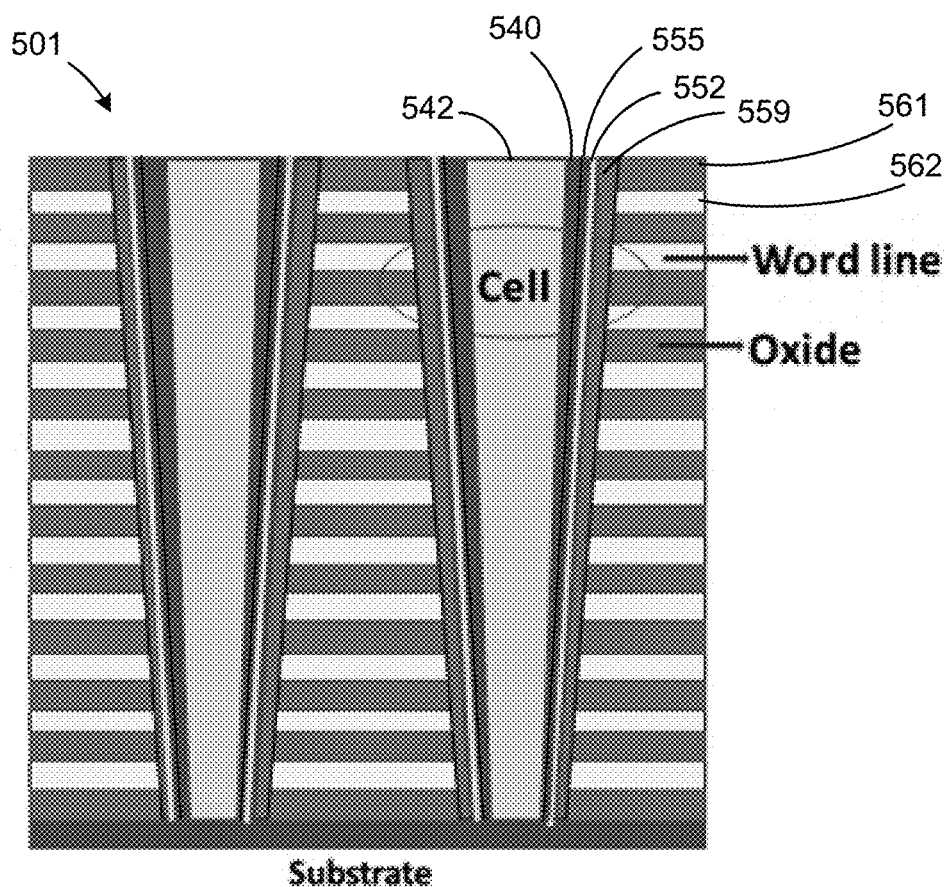
FIG. 12 is a schematic illustrating a cross-sectional view of an exemplary embodiment of a three-dimensional (3D) memory structure having vertically-stacked memory cells.

FIG. 12 shows a cross section of an exemplary embodiment of the 3D memory structure 501 shown by FIG. 11. FIG. 12 shows a 3D NAND flash memory structure that is known in the art. As shown by FIG. 12, the structure 501 has a tapered channel 540 that is wider at the top of the structure 501 and is narrower at the bottom of the structure 501. The channel 540 may be composed of a semiconductor, such as silicon. The channel 540 surrounds an oxide layer 542 and is between the oxide layer 542 and a tunnel oxide layer 555 through which charge may flow depending on applied voltages. The tunnel oxide layer 555 surrounds the channel 540, and a floating gate layer 552 surrounds the tunnel oxide layer 555. In addition, a gate oxide layer 559 surrounds the floating gate layer 552 and forms a blocking oxide that prevents charge from flowing out of the floating gate layer 552 through the gate oxide layer 559. Next to the gate oxide layer 559 are horizontal oxide layers 561 and conductive layers 562 that alternate vertically (in the y-direction) as shown. The horizontal conductive layers 562 form word lines. Bit lines (not shown in FIG. 12) may be respectively coupled to the channels 540 at the top of the depicted structure.

Figure 13:
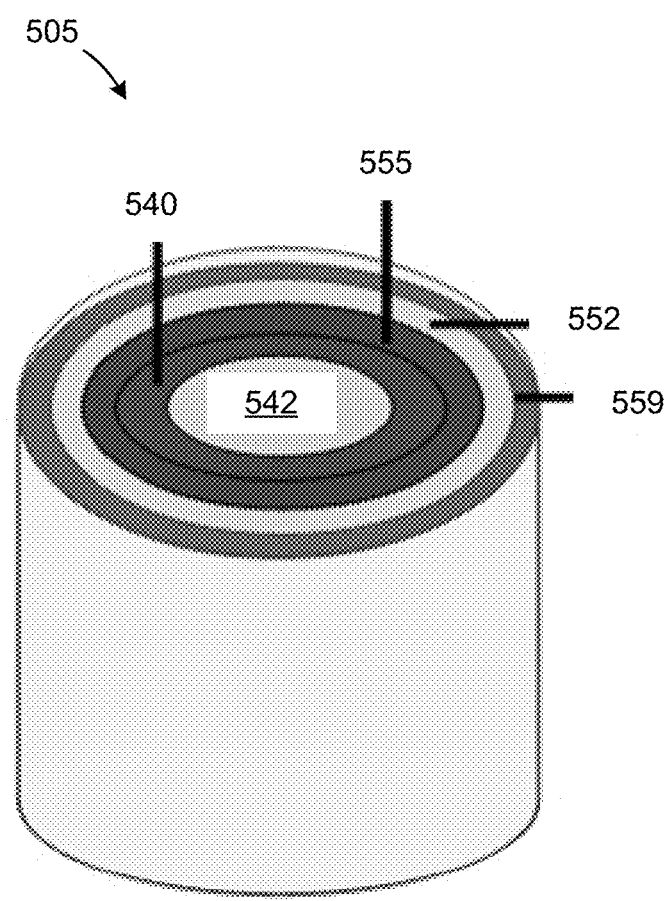
FIG. 13 is a schematic illustrating a perspective view of a memory cell of the 3D memory structure depicted by FIG. 12.

A cell 505 is formed at each intersection of a word line 562 and the floating gate layer 552. That is, when voltages are appropriately applied, as described above for FIG. 3, the tunnel oxide layer 555 permits charge to flow through it between the channel 540 and the region of the floating gate layer 552 that is between the cell's word line 562. As an example, during a program operation, voltages may be applied to the cell's word line 562 and bit line (not shown in FIG. 12) such that charge flows from the channel 540 through the tunnel oxide layer 555 to the portion of the floating gate layer 552 that is between the cell's word line 562 and the tunnel oxide layer 555. Conversely, during an erase operation, charge flows from the portion of the floating gate layer 552 that is between the cell's word line 562 and the tunnel oxide layer 555. Specifically, this charge flows through the tunnel oxide layer 555 to the channel 540. FIG. 13 depicts a cell 505 of the structure 501 depicted by FIG. 12 with the cell's word line 562 and blocking oxide layer 561 removed for illustrative purposes.

The fabrication a 3D NAND memory structure starts with deposition of alternate metal layers and oxide layers 561 as illustrated by FIG. 12. Each metal layer forms the word line 562 of the memory array connecting multiple memory cells 505 in that row. The channel 540 of the memory cell 505 is formed by creating a hole through the structure 501 with a reactive ion etching (RIE) process. The gate stack of the cells 505 is then formed by sequentially depositing the gate oxide layer 559, floating gate layer 552, and tunnel oxide layer 555 along the sidewall of the cylindrical trench.

Finally, a thin layer of channel 540 is deposited with hollow core filled with oxide to form layer 542 within the channel 540. Hence the cell structure of the 3-D NAND memory structure 501 resembles vertical-channel gate-all-around Metal-Oxide-Semiconductor Field-Effect Transistor (MOSFET), as illustrated by FIG. 13. The tapered shape of the cylindrical memory hole in which layers 540, 542, 555, 552, 559 are formed results from the inefficient RIE at the bottom rows. Thus, memory cells 505 near the bottom of the structure 501 typically have smaller diameter than the memory cells 505 in the top and middle of the structure 501.

As noted above, radiation may affect cells 505 differently depending on where they are located within the structure 501. For example, it has been observed that cells 505 close to the top of the structure 501 and cells 505 close to the bottom of the structure 501, referred to hereafter collectively as the "outer cells," are affected to a greater extent by radiation than cells, referred to hereafter as "inner cells," between the outer cells at the top and the outer cells at the bottom (e.g., cells that are closer to the middle of the structure 501).

The reasons for this disparate effect of radiation on the cells 505 are not fully understood. However, it is believed that it results from the way that many 3D memory structures are manufactured. In this regard, many 3D memory structures have a tapered channel, as shown by FIG. 12, due to a reactive-ion etching (REI) process that is used in the fabrication of these memory structures, as described above. Due to the taper, the memory cells 505 near the bottom of the structure 501 have a much smaller diameter or width relative the cells 505 higher in the structure 501 causing these outer cells 505 near the bottom of the structure 501 to experience faster charge loss due to radiation than cells 505 that are higher in the structure 501.

In addition, regarding the outer cells 505 near the top of the structure 501, the back end of line (BEOL) metals are typically formed at the top of the structure 501 above the cells 505 shown by FIG. 12 such that the outer cells 505 near the top of the chip are closer to the BEOL metals. Thus, these outer cells 505 near the top of the structure 501 likely experience higher dose enhancement effects compared to the cells 505 near the middle or the bottom of the structure 501. Note that other effects may contribute to the disparate effects of radiation on the different cell rows of the structure 501.

The memory system 110 may be designed based on the disparate effects of radiation on the cells 505 in an effort to better utilize the resources of the system 110 for mitigating the effects of such radiation. As an example, the strength of the ECC used to correct data errors may be varied across the structure 501 so that stronger ECC is used for data reads from cells 505 more susceptible to the effects of radiation.

In this regard, during a write operation, a data word is often written to adjacent memory cells 505 such that the bits of the same data word are stored in the same general area of the memory structure 501, such as the same row and/or adjacent rows. Each data word is also associated with a number of ECC bits that may be used to correct for errors in the data word. These ECC bits may be appended to the data word being written by a write operation and stored in the memory structure 501 along with the data word. When the data word is later read, the associated ECC bits are also read and returned to the memory controller 120 with the data word. The memory controller 120 may then use the ECC bits to perform an ECC algorithm in order to correct for a finite number of errors in the data word. Typically, a greater number of ECC bits per word enables for the correction of a greater number of errors or in other words a greater error correction capacity. In conventional memory systems, the strength of the ECC (or in other words the number of ECC bits per data word) is often the same for all words stored to the same memory chip 140.

However, in some embodiments of the present disclosure, stronger ECC is used for the outer memory cells 505 that are more susceptible to radiation than the inner memory cells 505. Thus, when a data word is to be written at a memory location defined by the outer memory cells 505, the memory controller 120 is configured to generate a greater number of ECC bits relative to a given data word to be stored in the inner memory cells 505, thereby increasing the error correction capacity of the ECC algorithm, and the memory controller 120 includes this greater number of ECC bits along with the data word in the write command sent to the memory chip 140 containing the memory structure 501. In executing the write command, the memory structure 501 stores the data word and its associated ECC bits at the memory location indicated by the write command.

Conversely, when a data word is to be written at a memory location defined by the inner memory cells 505, the memory controller 120 is configured to generate a lesser number of ECC bits relative to a given data word to be stored in the outer memory cells 505, thereby decreasing the error correction capacity of the ECC algorithm, and the memory controller 120 includes this lesser number of ECC bits along with the data word in the write command sent to the memory chip 140 containing the memory structure 501. In executing the write command, the memory structure 501 stores the data word and its associated ECC bits at the memory location indicated by the write command.

Since the data stored in the outer memory cells is associated with more ECC bits and, hence, stronger ECC, less data may be stored in same size of memory for the outer cells relative to the inner cells, since more outer cells are occupied with ECC bits. However, the stronger ECC enabled by more ECC bits per word enables a greater number of errors to be corrected per word, thereby enabling the system 100 to correct for more errors in the areas of memory most affected by radiation.

In other embodiments, the memory system 110 may be designed in other ways to better account for the disparate effects of radiation on different areas of memory. As an example, higher priority data may be stored in the inner memory cells 505 that are less susceptible to radiation. In this regard, data to be stored in the memory system 110 may be prioritized, such as for example where more important or critical data is associated with a higher priority. When the memory controller 120 receives a write request to store data, such write request may include a priority value indicating the priority assigned to the data to be stored. Such priority may be determined in any of various ways. As an example, the importance or priority of data may be indicated by a user, such as when the user inputs the data to the device 100 in which the memory system 110 is located. In another example, the priority of data may be determined by the device 100 based on the data's source, such as which software application generated the data. Any methodology or technique for prioritizing data may be used.

When the memory controller 120 receives a write request, the memory controller 120 is configured to analyze the data's priority value in the write request and to select a memory location for storing the data based on the priority value. As an example, if the priority value indicates a high priority for the data, the memory controller 120 may determine to write the data to inner memory cells 505 that are less susceptible to radiation. However, if the priority value indicates a low priority for the data, the memory controller 120 may determine to write the data to outer memory cells 505 that are more susceptible to radiation, thereby preserving inner memory cells 505 for higher priority data.

After determining the appropriate memory location for the data, the memory controller 120 transmits a write command to the memory structure 501 that is to store the data. Such command indicates the memory location where the memory controller 120 decided to store the data, and the memory chip then writes the data to the indicated memory location. Thus, higher priority data may be written to an area of memory that is likely to experience fewer data errors from radiation, thereby helping to preserve and protect the high priority data while it is stored in the memory system 110.

Note that the priority assigned to the data may also be used control the strength of the ECC used for the data. As an example, as described above, the memory system 110, it is possible for data to be stored in at least some of the outer memory cells 505 to be associated with stronger ECC than other cells. For data assigned a certain priority (e.g., a medium priority), the memory controller 120 may be configured to store the data in the outer memory cells 505 that are more susceptible to radiation but then use a stronger ECC for such data, relative to the strength of ECC used for lower priority data. Any number of priority levels may be used, and any number or combination of techniques for mitigating the effects may be used based on the assigned priority.

The designer of memory system 110 may perform testing on the memory system 110 or other memory systems of similar designs in order to assess the effects of radiation on the different memory cells 505. Thus, the relative vulnerability of each memory cell 505 or of different areas may be ascertained or estimated. Based on such analysis, the designer may then configure the memory controller 120 to implement the techniques described herein in order to mitigate the effects of the radiation. As an example, the memory controller 120 may be configured such that areas or cells 505 less susceptible to the effects of radiation are used to store higher priority data and/or that areas or cells 505 more susceptible to the effects of radiation are associated with stronger ECC.

Note that, in some embodiments, the radiation measurements made by the system 110 may be performed on different rows or areas of the memory structure 501 so that the memory controller 120 can assess the effects of radiation on different areas of the memory structure 501. As an example, for the purposes of assessing radiation, the structure 501 may be segmented into different areas, and radiation may be separately sensed in each different area. For example, the structure 501 may be segmented into (1) a top area that includes the outer memory elements 505 at the top of the structure 501, (2) a bottom area that includes the outer memory elements 505 at the bottom of the structure 501, and (3) a middle are that includes the inner memory elements 505 in the middle of the chip between the top area and the bottom area. In each such area, a portion of the memory may be allocated for sensing radiation based on the number of bit flips that occur in that portion of the memory according to the techniques described above. Thus, for each area, a radiation value is generated indicating an amount of radiation sensed in that area.

For each area, the memory controller may then select one or more techniques for mitigating the effects of radiation based on the radiation value for that area. As an example, according to the techniques described above, the memory controller 120 may be configured to determine, based on the radiation value for a given area, whether to perform one of the following on the memory cells 505 in the respective area: (1) data refresh operation, (2) adjust read voltage, or (3) fault repair operation. Thus, the radiation-mitigating technique selected for an area of the structure 501 is optimally selected based on the amount of radiation that has been sensed for that particular area. As an example, if a relatively high amount of radiation is sensed for the top area that includes outer cells 505 near the top of the structure 501, the memory controller 120 may perform a data refresh operation on such cells 505. However, if a lower amount of radiation is sensed for the middle area that includes inner cells 505 between the top area and the bottom area of the structure 501, the memory controller 120 may perform a different operation, such as adjusting the read voltage and/or performing a fault repair operation.

Note that the structure 501 may be segmented in any manner for the purpose of assessing radiation exposure. As an example, rather than assessing three areas, any number of areas may be assessed. For example, each row may have memory allocated for sensing radiation, and the memory controller 120 may assess radiation exposure and select the appropriate radiation-mitigating techniques to employ on a row-by-row basis. Alternatively, any number of rows or other areas of memory may be assessed for radiation and appropriately controlled based on the amount of radiation sensed. Also, in other embodiments, it may be possible to assess radiation in different areas of the memory structure 501 without allocating memory for this purpose, such as for example using sensors embedded in the memory structure 501 or otherwise configured to assess radiation in different areas of the structure 501. Yet other techniques for sensing radiation and/or controlling the memory structure 501 to mitigate the effects of radiation are possible.

Several embodiments described herein have been described in the context of flash memory. However, it is possible for radiation to have similar effects on other types of memory, and the techniques described for mitigating the effects of radiation may be used in other types of memory, as may be desired.

The foregoing is merely illustrative of the principles of this disclosure and various modifications may be made by those skilled in the art without departing from the scope of this disclosure. The above-described embodiments are presented for purposes of illustration and not of limitation. The present disclosure also can take many forms other than those explicitly described herein. For instance, the order of particular steps or the form of particular processes can be changed in some cases to perform equivalent steps. Accordingly, it is emphasized that this disclosure is not limited to the explicitly disclosed methods, systems, and apparatuses, but is intended to include variations to and modifications thereof, which are within the spirit of the following claims.

The invention claimed is:

1. An electronic device, comprising:
    flash memory having a plurality of memory cells; and
    a memory controller configured to determine a value indicative of an amount of radiation exposed to the electronic device, the memory controller further configured to perform based on the value at least one operation for compensating for charge leakage in the plurality of memory cells induced by the sensed radiation, wherein the memory controller is configured to select a first operation for compensating for the charge leakage if the value is in a first range, and wherein the memory controller is configured to select a second operation for compensating for the charge leakage if the value is in a second range.

2. The electronic device of claim 1, wherein the memory controller is configured to control a duration of the at least one operation based on the value.

3. The electronic device of claim 1, wherein the memory controller, in performing the at least one operation, is configured to adjust a read voltage applied to at least a first memory cell of the plurality of memory cells based on the value, and wherein the flash memory comprises circuitry that is configured to determine a data value stored in the first memory cell based on whether a voltage of charge stored in the memory cell exceeds the read voltage.

4. The electronic device of claim 3, wherein the memory controller is configured to reduce the read voltage by an amount corresponding to the value.

5. The electronic device of claim 1, wherein the at least one operation includes a data refresh operation for re-writing data stored in the plurality of memory cells.

6. The electronic device of claim 5, wherein the memory controller, in performing the data refresh operation, is configured to read the data from the plurality of memory cells, correct for at least one error in the read data, and write the data to an erased area of the flash memory after correcting for the at least one error in the read data.

7. The electronic device of claim 1, wherein the memory controller, in performing the at least one operation, is configured to read data from a memory location comprising the plurality of memory cells, correct at least one error in the read data, and write the data to the memory location after correcting the at least one error in the read data.

8. The electronic device of claim 1, wherein the memory controller is configured to receive the value from a dosimeter.

9. The electronic device of claim 1, wherein the memory controller is configured to calculate the value based on a number of errors detected in the flash memory.

10. A method for use in an electronic device having flash memory, comprising:
    determining a value indicative of an amount of radiation exposed to the electronic device;
    comparing the value to a threshold;
    determining, based on the comparing, whether to perform at least one operation for compensating for charge leakage in the flash memory induced by the radiation; and
    performing the at least one operation, thereby compensating for the charge leakage, wherein the performing the at least one operation comprises selecting a first operation for compensating for the charge leakage if the value is in a first range and selecting a second operation for compensating for the charge leakage if the value is in a second range.

11. The method of claim 10, further comprising controlling a duration of the at least one operation based on the value.

12. The method of claim 10, further comprising performing a read operation on a memory cell of the flash memory by applying a read voltage to the memory cell and determining whether a voltage of charge in the memory cell exceeds the read voltage, wherein the performing the at least one operation comprises adjusting the read voltage based on the value.

13. The method of claim 12, wherein the adjusting comprises reducing the read voltage by an amount corresponding to the value.

14. The method of claim 10, wherein the performing the at least one operation comprises re-writing data stored in the flash memory.

15. The method of claim 10, wherein the performing the at least one operation comprises:
   reading data from the flash memory;
   correcting for at least one error in the read data; and
   writing the read data to the flash memory after the correcting.

16. The method of claim 10, wherein the performing the at least one operation comprises:
   reading data from a memory location of the flash memory;
   correcting at least one error in the read data; and
   writing the read data to the memory location after the correcting.

17. An electronic device, comprising:
   flash memory having a plurality of memory cells; and
   a memory controller configured to determine a value indicative of an amount of radiation exposed to the electronic device, the memory controller further configured to perform based on the value at least one operation for compensating for charge leakage in the plurality of memory cells induced by the sensed radiation, wherein the memory controller, in performing the at least one operation, is configured to force charge into at least one of the plurality of memory cells associated with a data error such that the at least one of the plurality of memory cells is transitioned from an erase state to a program state.

18. The electronic device of claim 1, further comprising An electronic device, comprising:
   a three-dimensional (3D) memory structure having flash memory, the flash memory having a plurality of memory cells; and
   a memory controller configured to determine a value indicative of an amount of radiation exposed to the electronic device, the memory controller further configured to perform based on the value at least one operation for compensating for charge leakage in the plurality of memory cells induced by the sensed radiation,
   wherein the value is associated with a first area of the 3D memory structure and the amount of the radiation is sensed in the first area of the 3D memory structure, wherein the memory controller is configured to perform based on the value at least a first operation for compensating for the charge leakage in the first area, wherein the memory controller is configured to determine a second value associated with a second area of the 3D memory structure, wherein the second value is indicative of an amount of radiation sensed by the electronic device in the second area, and wherein the memory controller is configured to perform based on the second value at least a second operation for compensating for charge leakage in the second area.

19. A method for use in an electronic device having flash memory, comprising:
   determining a value indicative of an amount of radiation exposed to the electronic device, wherein the flash memory is in a three-dimensional memory structure, and wherein the value is associated with a first area of the 3D memory structure and the amount of the radiation is sensed in the first area of the 3D memory structure;
   comparing the value to a threshold;
   determining, based on the comparing, whether to perform at least one operation for compensating for charge leakage in the flash memory induced by the radiation;
   performing the at least one operation, thereby compensating for the charge leakage, wherein the performing the at least one operation comprises performing based on the value at least a first operation for compensating for the charge leakage in the first area;
   determining a second value associated with a second area of the 3D memory structure, the second value indicative of an amount of radiation sensed by the electronic device in the second area; and
   performing based on the second value at least a second operation for compensating for charge leakage in the second area.

20. A method for use in an electronic device having flash memory, comprising:
   determining a value indicative of an amount of radiation exposed to the electronic device;
   comparing the value to a threshold;
   determining, based on the comparing, whether to perform at least one operation for compensating for charge leakage in the flash memory induced by the radiation; and
   performing the at least one operation, thereby compensating for the charge leakage, wherein the performing the at least one operation comprises forcing charge into at least one of a plurality of memory cells of the flash memory associated with a data error such that the at least one of the plurality of memory cells is transitioned from an erase state to a program state.

* * * * *